United States Patent
Gray

(10) Patent No.: US 8,103,934 B2
(45) Date of Patent: Jan. 24, 2012

(54) HIGH SPEED MEMORY ERROR DETECTION AND CORRECTION USING INTERLEAVED (8,4) LBCS

(75) Inventor: Scott L. Gray, Peoria, AZ (US)

(73) Assignee: Honeywell International Inc., Morristown, NJ (US)

(*) Notice: Subject to any disclaimer, the term of this patent is extended or adjusted under 35 U.S.C. 154(b) by 1067 days.

(21) Appl. No.: 11/963,379

(22) Filed: Dec. 21, 2007

(65) Prior Publication Data

US 2009/0164867 A1    Jun. 25, 2009

(51) Int. Cl.
*H03M 13/00* (2006.01)
*G11C 29/00* (2006.01)

(52) U.S. Cl. ........ 714/758; 714/752; 714/763; 714/785; 714/800

(58) Field of Classification Search .................. 714/758, 714/752, 763, 785, 800
See application file for complete search history.

(56) References Cited

U.S. PATENT DOCUMENTS

| | | | |
|---|---|---|---|
| 4,617,664 A | 10/1986 | Aichelmann et al. | |
| 4,635,262 A | 1/1987 | Kittel | |
| 4,958,349 A | 9/1990 | Tanner et al. | |
| 5,086,429 A | 2/1992 | Gray et al. | |
| 5,251,219 A * | 10/1993 | Babb | 714/755 |
| 5,537,429 A | 7/1996 | Inoue | |
| 5,751,744 A * | 5/1998 | Babb | 714/800 |
| 5,856,987 A * | 1/1999 | Holman | 714/752 |
| 5,909,541 A | 6/1999 | Sampson et al. | |
| 6,223,320 B1 * | 4/2001 | Dubey et al. | 714/757 |
| 6,763,492 B1 | 7/2004 | Hurt et al. | |
| 6,948,091 B2 * | 9/2005 | Bartels et al. | 714/11 |
| 6,981,197 B2 | 12/2005 | Liu | |
| 2005/0213693 A1 | 9/2005 | Page | |
| 2006/0156191 A1 | 7/2006 | Driediger | |

* cited by examiner

*Primary Examiner* — John J Tabone, Jr.
(74) *Attorney, Agent, or Firm* — Fogg & Powers LLC

(57) ABSTRACT

Methods and systems are disclosed for the detection and correction of memory errors using code words with a quantity, divisible by 4, of data bits, with an equal quantity of check bits, and having the check bits and data bits interleaved. Upon execution of a memory write instruction, a processor may send a memory word to a check bit generator that generates the check bits before the code word is written to a memory unit. Upon a signal from the processor that a memory read is requested, the memory unit may send a stored code word to a syndrome bit generator to generate a syndrome vector. The syndrome vector may then be sent to a correction bit generator and an uncorrectable error detector. These units may send corrected bits and an uncorrectable error signal, respectively, to the processor.

20 Claims, 9 Drawing Sheets

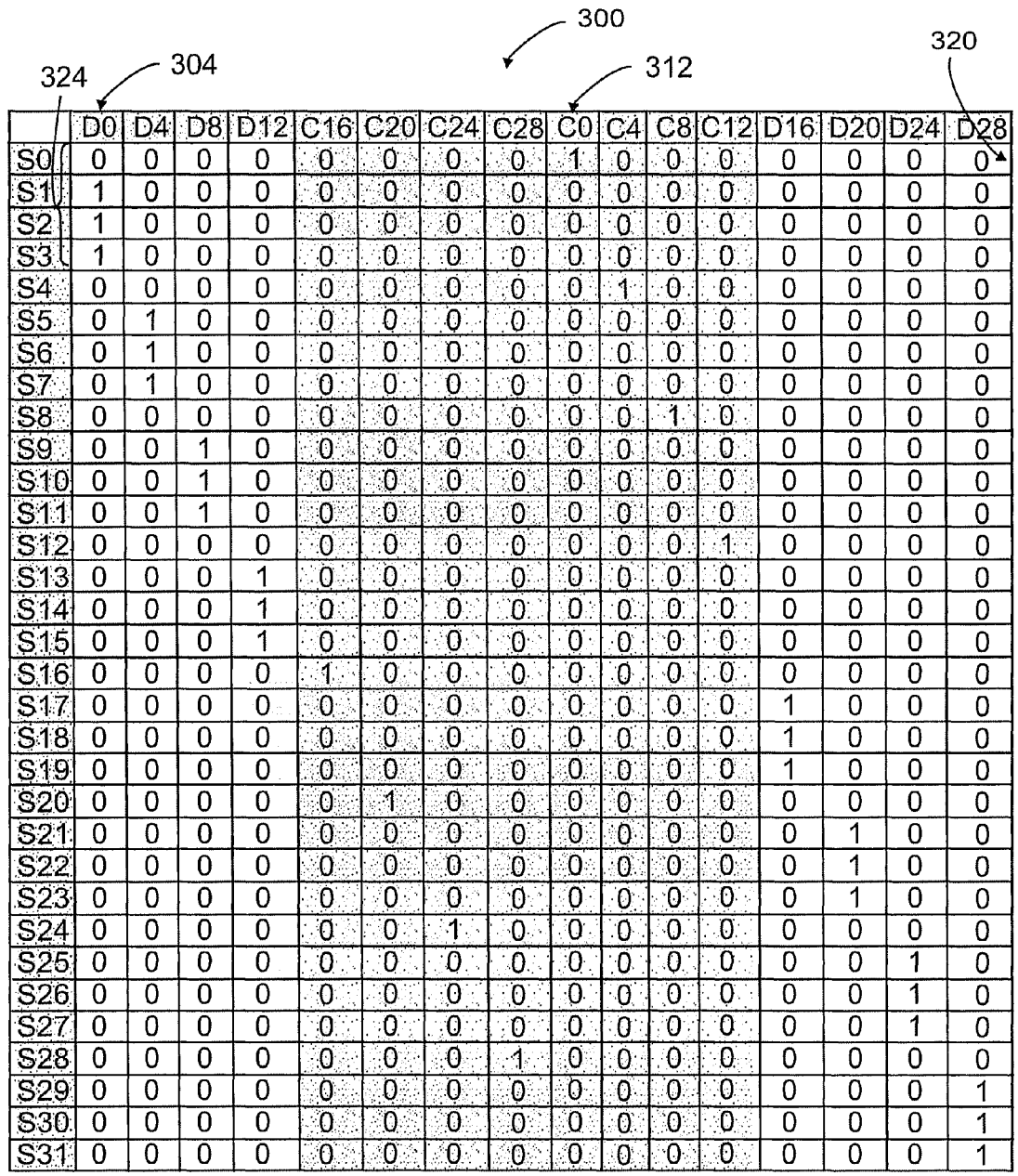
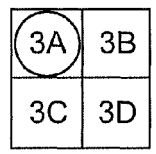
FIG. 3A

|  | D1 | D5 | D9 | D13 | C17 | C21 | C25 | C29 | C1 | C5 | C9 | C13 | D17 | D21 | D25 | D29 |
|---|---|---|---|---|---|---|---|---|---|---|---|---|---|---|---|---|
| S0 | 1 | 0 | 0 | 0 | 0 | 0 | 0 | 0 | 0 | 0 | 0 | 0 | 0 | 0 | 0 | 0 |
| S1 | 0 | 0 | 0 | 0 | 0 | 0 | 0 | 0 | 1 | 0 | 0 | 0 | 0 | 0 | 0 | 0 |
| S2 | 1 | 0 | 0 | 0 | 0 | 0 | 0 | 0 | 0 | 0 | 0 | 0 | 0 | 0 | 0 | 0 |
| S3 | 1 | 0 | 0 | 0 | 0 | 0 | 0 | 0 | 0 | 0 | 0 | 0 | 0 | 0 | 0 | 0 |
| S4 | 0 | 1 | 0 | 0 | 0 | 0 | 0 | 0 | 0 | 0 | 0 | 0 | 0 | 0 | 0 | 0 |
| S5 | 0 | 0 | 0 | 0 | 0 | 0 | 0 | 0 | 0 | 0 | 1 | 0 | 0 | 0 | 0 | 0 |
| S6 | 0 | 1 | 0 | 0 | 0 | 0 | 0 | 0 | 0 | 0 | 0 | 0 | 0 | 0 | 0 | 0 |
| S7 | 0 | 1 | 0 | 0 | 0 | 0 | 0 | 0 | 0 | 0 | 0 | 0 | 0 | 0 | 0 | 0 |
| S8 | 0 | 0 | 1 | 0 | 0 | 0 | 0 | 0 | 0 | 0 | 0 | 0 | 0 | 0 | 0 | 0 |
| S9 | 0 | 0 | 0 | 0 | 0 | 0 | 0 | 0 | 0 | 0 | 0 | 1 | 0 | 0 | 0 | 0 |
| S10 | 0 | 0 | 1 | 0 | 0 | 0 | 0 | 0 | 0 | 0 | 0 | 0 | 0 | 0 | 0 | 0 |
| S11 | 0 | 0 | 1 | 0 | 0 | 0 | 0 | 0 | 0 | 0 | 0 | 0 | 0 | 0 | 0 | 0 |
| S12 | 0 | 0 | 0 | 1 | 0 | 0 | 0 | 0 | 0 | 0 | 0 | 0 | 0 | 0 | 0 | 0 |
| S13 | 0 | 0 | 0 | 0 | 0 | 0 | 0 | 0 | 0 | 0 | 0 | 0 | 1 | 0 | 0 | 0 |
| S14 | 0 | 0 | 0 | 1 | 0 | 0 | 0 | 0 | 0 | 0 | 0 | 0 | 0 | 0 | 0 | 0 |
| S15 | 0 | 0 | 0 | 1 | 0 | 0 | 0 | 0 | 0 | 0 | 0 | 0 | 0 | 0 | 0 | 0 |
| S16 | 0 | 0 | 0 | 0 | 0 | 0 | 0 | 0 | 0 | 0 | 0 | 0 | 1 | 0 | 0 | 0 |
| S17 | 0 | 0 | 0 | 0 | 1 | 0 | 0 | 0 | 0 | 0 | 0 | 0 | 0 | 0 | 0 | 0 |
| S18 | 0 | 0 | 0 | 0 | 0 | 0 | 0 | 0 | 0 | 0 | 0 | 0 | 1 | 0 | 0 | 0 |
| S19 | 0 | 0 | 0 | 0 | 0 | 0 | 0 | 0 | 0 | 0 | 0 | 0 | 1 | 0 | 0 | 0 |
| S20 | 0 | 0 | 0 | 0 | 0 | 0 | 0 | 0 | 0 | 0 | 0 | 0 | 0 | 1 | 0 | 0 |
| S21 | 0 | 0 | 0 | 0 | 0 | 1 | 0 | 0 | 0 | 0 | 0 | 0 | 0 | 0 | 0 | 0 |
| S22 | 0 | 0 | 0 | 0 | 0 | 0 | 0 | 0 | 0 | 0 | 0 | 0 | 0 | 1 | 0 | 0 |
| S23 | 0 | 0 | 0 | 0 | 0 | 0 | 0 | 0 | 0 | 0 | 0 | 0 | 0 | 1 | 0 | 0 |
| S24 | 0 | 0 | 0 | 0 | 0 | 0 | 0 | 0 | 0 | 0 | 0 | 0 | 0 | 0 | 1 | 0 |
| S25 | 0 | 0 | 0 | 0 | 0 | 0 | 1 | 0 | 0 | 0 | 0 | 0 | 0 | 0 | 0 | 0 |
| S26 | 0 | 0 | 0 | 0 | 0 | 0 | 0 | 0 | 0 | 0 | 0 | 0 | 0 | 0 | 1 | 0 |
| S27 | 0 | 0 | 0 | 0 | 0 | 0 | 0 | 0 | 0 | 0 | 0 | 0 | 0 | 0 | 1 | 0 |
| S28 | 0 | 0 | 0 | 0 | 0 | 0 | 0 | 0 | 0 | 0 | 0 | 0 | 0 | 0 | 0 | 1 |
| S29 | 0 | 0 | 0 | 0 | 0 | 0 | 0 | 1 | 0 | 0 | 0 | 0 | 0 | 0 | 0 | 0 |
| S30 | 0 | 0 | 0 | 0 | 0 | 0 | 0 | 0 | 0 | 0 | 0 | 0 | 0 | 0 | 0 | 1 |
| S31 | 0 | 0 | 0 | 0 | 0 | 0 | 0 | 0 | 0 | 0 | 0 | 0 | 0 | 0 | 0 | 1 |

| | D2 | D6 | D10 | D14 | C18 | C22 | C26 | C30 | C2 | C6 | C10 | C14 | D18 | D22 | D26 | D30 |
|---|---|---|---|---|---|---|---|---|---|---|---|---|---|---|---|---|
| S0 | 1 | 0 | 0 | 0 | 0 | 0 | 0 | 0 | 0 | 0 | 0 | 0 | 0 | 0 | 0 | 0 |
| S1 | 1 | 0 | 0 | 0 | 0 | 0 | 0 | 0 | 0 | 0 | 0 | 0 | 0 | 0 | 0 | 0 |
| S2 | 0 | 0 | 0 | 0 | 0 | 0 | 0 | 0 | 1 | 0 | 0 | 0 | 0 | 0 | 0 | 0 |
| S3 | 1 | 0 | 0 | 0 | 0 | 0 | 0 | 0 | 0 | 0 | 0 | 0 | 0 | 0 | 0 | 0 |
| S4 | 0 | 1 | 0 | 0 | 0 | 0 | 0 | 0 | 0 | 0 | 0 | 0 | 0 | 0 | 0 | 0 |
| S5 | 0 | 1 | 0 | 0 | 0 | 0 | 0 | 0 | 0 | 0 | 0 | 0 | 0 | 0 | 0 | 0 |
| S6 | 0 | 0 | 0 | 0 | 0 | 0 | 0 | 0 | 0 | 1 | 0 | 0 | 0 | 0 | 0 | 0 |
| S7 | 0 | 1 | 0 | 0 | 0 | 0 | 0 | 0 | 0 | 0 | 0 | 0 | 0 | 0 | 0 | 0 |
| S8 | 0 | 0 | 1 | 0 | 0 | 0 | 0 | 0 | 0 | 0 | 0 | 0 | 0 | 0 | 0 | 0 |
| S9 | 0 | 0 | 1 | 0 | 0 | 0 | 0 | 0 | 0 | 0 | 0 | 0 | 0 | 0 | 0 | 0 |
| S10 | 0 | 0 | 0 | 0 | 0 | 0 | 0 | 0 | 0 | 0 | 1 | 0 | 0 | 0 | 0 | 0 |
| S11 | 0 | 0 | 1 | 0 | 0 | 0 | 0 | 0 | 0 | 0 | 0 | 0 | 0 | 0 | 0 | 0 |
| S12 | 0 | 0 | 0 | 1 | 0 | 0 | 0 | 0 | 0 | 0 | 0 | 0 | 0 | 0 | 0 | 0 |
| S13 | 0 | 0 | 0 | 1 | 0 | 0 | 0 | 0 | 0 | 0 | 0 | 0 | 0 | 0 | 0 | 0 |
| S14 | 0 | 0 | 0 | 0 | 0 | 0 | 0 | 0 | 0 | 0 | 0 | 1 | 0 | 0 | 0 | 0 |
| S15 | 0 | 0 | 0 | 1 | 0 | 0 | 0 | 0 | 0 | 0 | 0 | 0 | 0 | 0 | 0 | 0 |
| S16 | 0 | 0 | 0 | 0 | 0 | 0 | 0 | 0 | 0 | 0 | 0 | 0 | 1 | 0 | 0 | 0 |
| S17 | 0 | 0 | 0 | 0 | 0 | 0 | 0 | 0 | 0 | 0 | 0 | 0 | 1 | 0 | 0 | 0 |
| S18 | 0 | 0 | 0 | 0 | 1 | 0 | 0 | 0 | 0 | 0 | 0 | 0 | 0 | 0 | 0 | 0 |
| S19 | 0 | 0 | 0 | 0 | 0 | 0 | 0 | 0 | 0 | 0 | 0 | 0 | 1 | 0 | 0 | 0 |
| S20 | 0 | 0 | 0 | 0 | 0 | 0 | 0 | 0 | 0 | 0 | 0 | 0 | 0 | 1 | 0 | 0 |
| S21 | 0 | 0 | 0 | 0 | 0 | 0 | 0 | 0 | 0 | 0 | 0 | 0 | 0 | 1 | 0 | 0 |
| S22 | 0 | 0 | 0 | 0 | 0 | 1 | 0 | 0 | 0 | 0 | 0 | 0 | 0 | 0 | 0 | 0 |
| S23 | 0 | 0 | 0 | 0 | 0 | 0 | 0 | 0 | 0 | 0 | 0 | 0 | 0 | 1 | 0 | 0 |
| S24 | 0 | 0 | 0 | 0 | 0 | 0 | 0 | 0 | 0 | 0 | 0 | 0 | 0 | 0 | 1 | 0 |
| S25 | 0 | 0 | 0 | 0 | 0 | 0 | 0 | 0 | 0 | 0 | 0 | 0 | 0 | 0 | 1 | 0 |
| S26 | 0 | 0 | 0 | 0 | 0 | 0 | 1 | 0 | 0 | 0 | 0 | 0 | 0 | 0 | 0 | 0 |
| S27 | 0 | 0 | 0 | 0 | 0 | 0 | 0 | 0 | 0 | 0 | 0 | 0 | 0 | 0 | 1 | 0 |
| S28 | 0 | 0 | 0 | 0 | 0 | 0 | 0 | 0 | 0 | 0 | 0 | 0 | 0 | 0 | 0 | 1 |
| S29 | 0 | 0 | 0 | 0 | 0 | 0 | 0 | 0 | 0 | 0 | 0 | 0 | 0 | 0 | 0 | 1 |
| S30 | 0 | 0 | 0 | 0 | 0 | 0 | 0 | 1 | 0 | 0 | 0 | 0 | 0 | 0 | 0 | 0 |
| S31 | 0 | 0 | 0 | 0 | 0 | 0 | 0 | 0 | 0 | 0 | 0 | 0 | 0 | 0 | 0 | 1 |

FIG. 3C

| | D3 | D7 | D11 | D15 | C19 | C23 | C27 | C31 | C3 | C7 | C11 | C15 | D19 | D23 | D27 | D31 |
|---|---|---|---|---|---|---|---|---|---|---|---|---|---|---|---|---|
| S0 | 1 | 0 | 0 | 0 | 0 | 0 | 0 | 0 | 0 | 0 | 0 | 0 | 0 | 0 | 0 | 0 |
| S1 | 1 | 0 | 0 | 0 | 0 | 0 | 0 | 0 | 0 | 0 | 0 | 0 | 0 | 0 | 0 | 0 |
| S2 | 1 | 0 | 0 | 0 | 0 | 0 | 0 | 0 | 0 | 0 | 0 | 0 | 0 | 0 | 0 | 0 |
| S3 | 0 | 0 | 0 | 0 | 0 | 0 | 0 | 0 | 1 | 0 | 0 | 0 | 0 | 0 | 0 | 0 |
| S4 | 0 | 1 | 0 | 0 | 0 | 0 | 0 | 0 | 0 | 0 | 0 | 0 | 0 | 0 | 0 | 0 |
| S5 | 0 | 1 | 0 | 0 | 0 | 0 | 0 | 0 | 0 | 0 | 0 | 0 | 0 | 0 | 0 | 0 |
| S6 | 0 | 1 | 0 | 0 | 0 | 0 | 0 | 0 | 0 | 0 | 0 | 0 | 0 | 0 | 0 | 0 |
| S7 | 0 | 0 | 0 | 0 | 0 | 0 | 0 | 0 | 0 | 1 | 0 | 0 | 0 | 0 | 0 | 0 |
| S8 | 0 | 0 | 1 | 0 | 0 | 0 | 0 | 0 | 0 | 0 | 0 | 0 | 0 | 0 | 0 | 0 |
| S9 | 0 | 0 | 1 | 0 | 0 | 0 | 0 | 0 | 0 | 0 | 0 | 0 | 0 | 0 | 0 | 0 |
| S10 | 0 | 0 | 1 | 0 | 0 | 0 | 0 | 0 | 0 | 0 | 0 | 0 | 0 | 0 | 0 | 0 |
| S11 | 0 | 0 | 0 | 0 | 0 | 0 | 0 | 0 | 0 | 0 | 1 | 0 | 0 | 0 | 0 | 0 |
| S12 | 0 | 0 | 0 | 1 | 0 | 0 | 0 | 0 | 0 | 0 | 0 | 0 | 0 | 0 | 0 | 0 |
| S13 | 0 | 0 | 0 | 1 | 0 | 0 | 0 | 0 | 0 | 0 | 0 | 0 | 0 | 0 | 0 | 0 |
| S14 | 0 | 0 | 0 | 1 | 0 | 0 | 0 | 0 | 0 | 0 | 0 | 0 | 0 | 0 | 0 | 0 |
| S15 | 0 | 0 | 0 | 0 | 0 | 0 | 0 | 0 | 0 | 0 | 0 | 1 | 0 | 0 | 0 | 0 |
| S16 | 0 | 0 | 0 | 0 | 0 | 0 | 0 | 0 | 0 | 0 | 0 | 0 | 1 | 0 | 0 | 0 |
| S17 | 0 | 0 | 0 | 0 | 0 | 0 | 0 | 0 | 0 | 0 | 0 | 0 | 1 | 0 | 0 | 0 |
| S18 | 0 | 0 | 0 | 0 | 0 | 0 | 0 | 0 | 0 | 0 | 0 | 0 | 1 | 0 | 0 | 0 |
| S19 | 0 | 0 | 0 | 0 | 1 | 0 | 0 | 0 | 0 | 0 | 0 | 0 | 0 | 0 | 0 | 0 |
| S20 | 0 | 0 | 0 | 0 | 0 | 0 | 0 | 0 | 0 | 0 | 0 | 0 | 0 | 1 | 0 | 0 |
| S21 | 0 | 0 | 0 | 0 | 0 | 0 | 0 | 0 | 0 | 0 | 0 | 0 | 0 | 1 | 0 | 0 |
| S22 | 0 | 0 | 0 | 0 | 0 | 0 | 0 | 0 | 0 | 0 | 0 | 0 | 0 | 1 | 0 | 0 |
| S23 | 0 | 0 | 0 | 0 | 0 | 1 | 0 | 0 | 0 | 0 | 0 | 0 | 0 | 0 | 0 | 0 |
| S24 | 0 | 0 | 0 | 0 | 0 | 0 | 0 | 0 | 0 | 0 | 0 | 0 | 0 | 0 | 1 | 0 |
| S25 | 0 | 0 | 0 | 0 | 0 | 0 | 0 | 0 | 0 | 0 | 0 | 0 | 0 | 0 | 1 | 0 |
| S26 | 0 | 0 | 0 | 0 | 0 | 0 | 0 | 0 | 0 | 0 | 0 | 0 | 0 | 0 | 1 | 0 |
| S27 | 0 | 0 | 0 | 0 | 0 | 0 | 1 | 0 | 0 | 0 | 0 | 0 | 0 | 0 | 0 | 0 |
| S28 | 0 | 0 | 0 | 0 | 0 | 0 | 0 | 0 | 0 | 0 | 0 | 0 | 0 | 0 | 0 | 1 |
| S29 | 0 | 0 | 0 | 0 | 0 | 0 | 0 | 0 | 0 | 0 | 0 | 0 | 0 | 0 | 0 | 1 |
| S30 | 0 | 0 | 0 | 0 | 0 | 0 | 0 | 0 | 0 | 0 | 0 | 0 | 0 | 0 | 0 | 1 |
| S31 | 0 | 0 | 0 | 0 | 0 | 0 | 0 | 1 | 0 | 0 | 0 | 0 | 0 | 0 | 0 | 0 |

FIG. 3D

HIGH SPEED MEMORY ERROR DETECTION AND CORRECTION USING INTERLEAVED (8,4) LBCS

FIELD OF THE INVENTION

The present invention relates generally to the detection and correction of errors in memory devices. More particularly, the present invention relates to error detection and correction using subsets of data bits interleaved with equal numbers of check bits.

BACKGROUND OF THE INVENTION

In computing applications, processors may be communicatively linked to memory units, and processors may write data to and read data from those memory units while executing instructions. Events such as faults may cause a memory unit, or portions of a memory unit, to fail and corrupt data stored therein. The processor's use of such corrupted data may cause an error either by forcing the processor to halt the execution of a program or by allowing the processor to continue processing using incorrect data. An error due to corrupted data may go undetected by the processor.

When a processor writes data to memory, that data may be encoded according to an error correcting code in order to make the data discernible in the event of a memory fault. Encoding a data word through the use of an error correcting code increases the storage space necessary for the data word because check bits, also known as parity bits, are appended to the data bits. The data bits and check bits together constitute a code word. A linear block code (LBC) is a type of error correcting code in which a one-to-one mapping exists between data words and corresponding code words, and LBCs may be referred to using (n, k) notation, where n is the total number of bits in the code word and k is the total number of data bits. An (n, k) LBC has n-k check bits. When the processor reads data from memory, a stored code word may be used to generate a syndrome vector, which may be used to detect and to correct errors in the stored data bits. A corrected version of the stored data bits may then be sent to the processor in response to the memory read request.

Error correcting and detecting codes allow processors to continue executing properly in the face of some memory unit failures by building redundancy into data storage, although a code may detect more errors than it is able to correct. Due to the necessity for increased storage and increased data processing, error correcting codes may require increased hardware resources and may slow the execution rate of instructions on a processor. Error correction and detection may be implemented in field-programmable gate arrays (FPGAs) having partially pre-configured logic circuitry, such as lookup tables (LUTs) allowing only four or fewer inputs per table, and in such an implementation, every additional level of logic required by a particular error correcting code may increase the processing time necessary to write encoded data to memory or to read corrected data from memory.

In real-time systems, such as aerospace systems, the added expense of error correcting codes may be particularly difficult for a system to bear. A real-time system fails if it does not comply with specified real-time deadlines. For example, an aircraft may have to compute its position relative to the ground a particular number of times per second to continue to operate safely, and such a computation would be carried out by a real-time system on the aircraft. The added expense of error correction in a real-time system may not only cause delay in execution but also system failure due to missed deadlines. However, without some form of error correction, a real-time system is also vulnerable to system failure upon even the mildest of memory faults.

SUMMARY OF THE INVENTION

Systems and methods for error correction and detection are disclosed herein.

One example system detects and corrects memory errors in a memory word containing N data bits, wherein N is a numerical multiple of 4, using an interleaved code word. The interleaved code word contains 2N bits, with N check bits and N data bits from the memory word, and the check bits and the data bits are interleaved. The system further includes a check bit generator, a syndrome bit generator, and a correction bit generator.

The check bit generator comprises N blocks divided into groups, wherein a block performs logical operations on inputs to generate an output. Each group in the check bit generator contains 4 blocks; each block is in only one group; and a group of 4 blocks takes four data bits as inputs and generates four check bits as outputs. Each check bit is the output of a block, which applies a logical operation of XOR on three data bits, and each check bit is determined from a unique group of three data bits.

The syndrome bit generator comprises N blocks to generate N syndrome bits. Each syndrome bit is the output of a block, and each block applies a logical operation of XOR on four bits comprising three data bits and one check bit in total. For each syndrome bit, the three input data bits are the unique group of data bits from which the input check bit was determined.

The correction bit generator comprises N blocks to generate corrected bits. Each block has four inputs, one data bit and three syndrome bits, and one output. The data bit input to a block is a data bit to be corrected, and the three syndrome bits input to the block are the three syndrome bits that were determined using the data bit to be corrected. Each block applies a logical operation of XOR on the data bit and the result that outputs from a logical operation of AND on the three syndrome bits.

Another example system further includes an uncorrectable error detector that generates at least one signal indicating the presence or absence of a detectable yet uncorrectable error within a stored code word. The uncorrectable error detector includes a first level of N divided by 4 blocks, each taking four sequential syndrome bits as inputs. Each syndrome bit is only input to one block. Within the uncorrectable error detector, each block applies a logical operation of AND on a first result and a second result: the first result outputs from a logical operation of NOT THREE OF FOUR on all four syndrome bits, and the second result outputs from a logical operation of OR on all four syndrome bits.

Yet another example system includes a processing unit that is operable to write to and read from a memory unit and that generates a memory word containing N data bits, wherein N is a numerical multiple of 4. After the generation of check bits, the interleaved code word of data bits and check bits is written to the memory unit. When the processing unit accesses the memory word in the memory unit, the processing unit reads corrected data bits from the correction bit generator.

An example method detects and corrects memory errors. To begin, an interleaved code word containing 2N bits is generated with N check bits determined from the N data bits of a memory word, wherein N is a numerical multiple of 4. Syndrome bits may then be generated using N blocks performing logical operations on the stored data and check bits of the interleaved code word. Data bits may then be corrected using N blocks performing logical operations on the stored data bits and the syndrome bits.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Certain examples are described below in conjunction with the appended drawing figures, wherein like reference numerals refer to like elements in the various figures, and wherein:

FIGS. 3A, 3B, 3C and 3D illustrate an example H-matrix;

DETAILED DESCRIPTION OF THE INVENTION

Figure 1:
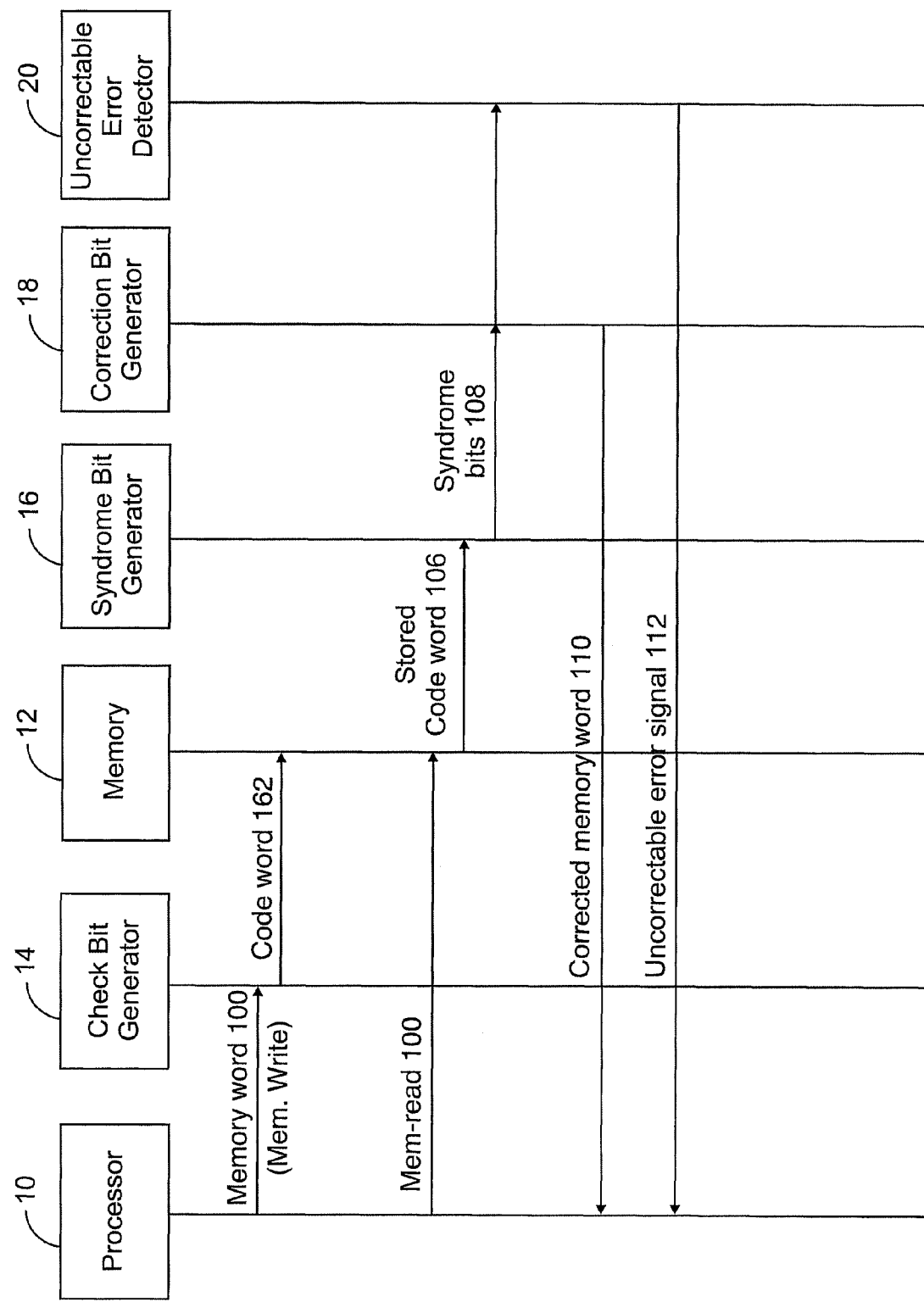
FIG. 1 is a data flow diagram depicting the interactions of a processor, a memory unit, and various error correction and detection units in an exemplary system.

Error correction and detection may be implemented in any system having a processor that writes to and reads from memory. The methods and systems disclosed herein provide for error correction and detection using a quantity of check bits equal to the quantity of data bits and with the data bits and the check bits interleaved in memory. FIG. 1 depicts an example data flow pattern between a processor 10, a memory unit 12, and various stages of error correction and detection logic—namely, a check bit generator 14, a syndrome bit generator 16, a correction bit generator 18 and an uncorrectable error detector 20—during error correction and detection.

Processor 10 may be any computing unit that executes instructions and interacts with other system components. Similarly, memory unit 12 may be any data storage unit, including but not limited to, read only memory (ROM), random access memory (RAM), double data rate—synchronous dynamic random access memory (DDR-SRAM), removable disk drive memory, hard disk memory, magnetic tape memory, and flash memory, that its communicatively linked to processor 10. Processor 10 and memory unit 12 may be linked together by a system bus that also links them to other components such as input and output devices. Processor 10 and memory unit 12 may be implemented with other system components, including the various error correction and detection units, in a single chipset.

Processor 10 may process a memory write instruction that generates a memory word 100 of data bits to be written to a particular address in memory unit 12. Rather than transmitting memory word 100 directly to memory unit 12, processor may transmit memory word 100 to check bit generator 14 to generate check bits that correspond with the data bits of memory word 100. Together, the data bits of memory word 100 and the check bits generated by check bit generator 14 to correspond to memory word 100 comprise a code word 102. Check bit generator 14 transmits code word 102 to memory unit 12 where code word 102 is written to the address specified in the memory write instruction.

Upon executing an instruction to read memory word 100, processor 10 may generate a signal 104 to memory unit 12. Signal 104 may contain a request for information from memory unit 12 and may contain the address of memory word 100. In response to signal 104, memory unit 12 may read stored code word 106. In a hypothetical memory unit not vulnerable to fault or failure, stored code word 106 would always be identical to code word 102, and both code words would contain all of the data bits of memory word 100 in their original form. However, because actual memory units, such as memory unit 12, are vulnerable to fault and failure, stored code word 106 may not be identical to code word 102 and may not contain the exact data bits of memory word 100. Therefore, it is preferable that stored code word 106 be analyzed for error and corrected before it is transmitted to processor 10.

Memory unit 12 transmits stored code word 106 to syndrome generator 16 so that stored code word 106 may be analyzed for error and corrected, if necessary. Syndrome generator 16 generates syndrome bits 108 from the data bits and check bits of stored code word 106. Syndrome generator 16 then transmits syndrome bits 108 to both correction bit generator 18 and uncorrectable error detector 20. Correction bit generator 18 uses both syndrome bits 108 and the data bits of stored code word 106 to generate a corrected memory word 110 that is transmitted to the processor in response to memory read signal 104. Uncorrectable error detector 20 uses only syndrome bits 108 to determine whether any of the errors detected in stored code word 106 are uncorrectable, meaning that the data stored in memory has been corrupted to such an extent that stored code word 106 no longer contains enough information from original memory word 100 to reconstruct memory word 100. Uncorrectable error detector 20 generates an uncorrectable error signal 112, which may be a single bit with 1 or TRUE corresponding to the presence of an uncorrectable error somewhere within stored code word 106, and transmits uncorrectable error signal 112 to processor 10.

During a memory write operation, the check bits of stored code word 106 may be generated from sending the data bits of memory word 100 through one level of digital logic in check bit generator 14. For example, Table 1 shows the check bit equations in the preferred (8,4)

TABLE 1

| Check Bit Equations. |
|---|
| C0 = D1 XOR D2 XOR D3 |
| C1 = D0 XOR D2 XOR D3 |
| C2 = D0 XOR D1 XOR D3 |
| C3 = D0 XOR D1 XOR D2 |
| C4 = D5 XOR D6 XOR D7 |
| C5 = D4 XOR D6 XOR D7 |
| C6 = D4 XOR D5 XOR D7 |
| C7 = D4 XOR D5 XOR D6 |
| C8 = D9 XOR D10 XOR D11 |
| C9 = D8 XOR D10 XOR D11 |
| C10 = D8 XOR D9 XOR D11 |
| C11 = D8 XOR D9 XOR D10 |
| C12 = D13 XOR D14 XOR D15 |
| C13 = D12 XOR D14 XOR D15 |
| C14 = D12 XOR D13 XOR D15 |
| C15 = D12 XOR D13 XOR D14 |
| C16 = D17 XOR D18 XOR D19 |
| C17 = D16 XOR D18 XOR D19 |
| C18 = D16 XOR D17 XOR D19 |
| C19 = D16 XOR D17 XOR D18 |
| C20 = D21 XOR D22 XOR D23 |
| C21 = D20 XOR D22 XOR D23 |
| C22 = D20 XOR D21 XOR D23 |

TABLE 1-continued

Check Bit Equations.

C23 = D20 XOR D21 XOR D22
C24 = D25 XOR D26 XOR D27
C25 = D24 XOR D26 XOR D27
C26 = D24 XOR D25 XOR D27
C27 = D24 XOR D25 XOR D26
C28 = D29 XOR D30 XOR D31
C29 = D28 XOR D30 XOR D31
C30 = D28 XOR D29 XOR D31
C31 = D28 XOR D29 XOR D30

X 8 embodiment. The (8,4) X 8 embodiment consists of eight (8,4) LBCs encoding 32 data bits (i.e., D0) into a code word having 32 check bits (i.e., C0). Data bits are divided into groups of four with each group of four corresponding to four check bits, and the four data bits of a group together with the four corresponding check bits constitute a single LBC. For example, in Table 1, data bits D0, D1, D2, and D3, along with check bits C0, C1, C2, and C3, constitute a single (8,4) LBC.

Figure 2:
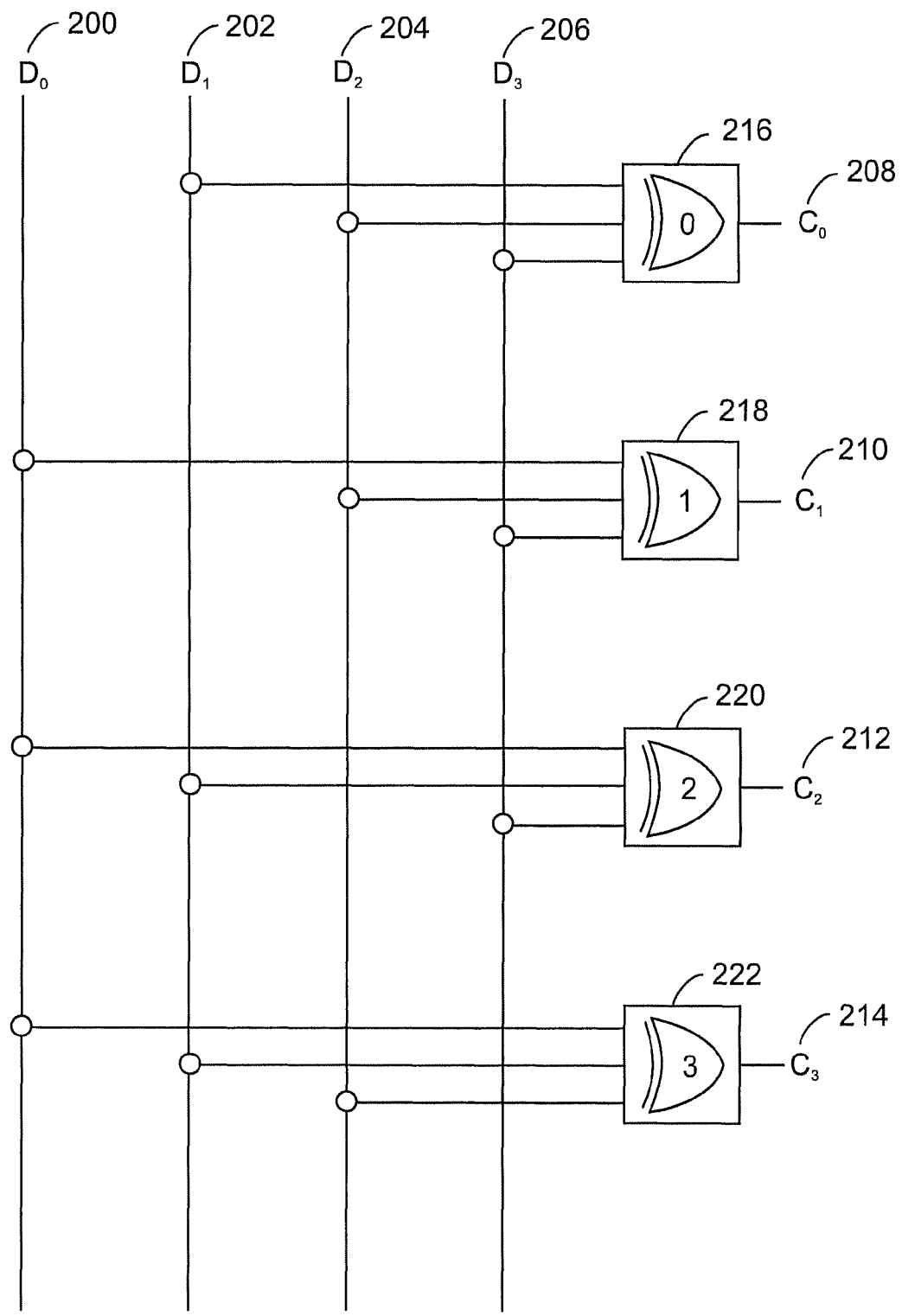
FIG. 2 is a schematic of one group in an example check bit generator.

FIG. 2 schematically depicts one group within example check bit generator 14 that generates check bits based on the equations in Table 1. Data lines 200, 202, 204, and 206 correspond to to-be-stored data bits D0, D1, D2, and D3, respectively, and data lines 208, 210, 212, and 214 correspond to generated check bits C0, C1, C2, and C3, respectively, which are collectively generated using only the four data bits shown. Each check bit is generated from a unique set of three data bits—i.e., no two check bits are generated from the same three data bits. Because in any group of four data bits there are only four unique combinations of three data bits, each of those unique combinations is used for a single check bit.

Blocks 216, 218, 220, and 222 indicate the logical operations that take place inside check bit generator 14. As shown in Table 1, each check bit is the output of an exclusive or (XOR) operation on the check bit's unique group of three data bits. Logical operations such as XOR, AND, and OR are referred to herein using all capital letters for clarity. Block 216 takes as its inputs D1 (from data line 202), D2 (from data line 204), and D3 (from data line 206) and generates C0 as an output. C0 is the result of the XOR of D1, D2, and D3, and the symbol inside of block 216 is a standard symbol representing the XOR function.

The use of a three-input XOR operation to generate a check bit may be implemented in a single level of logic; for example, blocks 216, 218, 220, and 222 may be implemented as four respective LUTs in an FPGA. The particular implementation of blocks may vary, but any combination of logic gates and circuitry that is functionally equivalent to a three-input XOR operation may be used. Check bit generator 14 may similarly generate the remaining 28 check bits from seven groups, each group having four data bits sent through a single level of digital logic. Indeed, the same check bit generation process may be used for any total number of data bits divisible by four.

To make stored data as robust as possible in the face of potential memory faults, two levels of interleaving may be used when storing code words in memory unit 12. For example, when code word 102 is written to memory, the data bits and the check bits may be interleaved, so that memory unit 12 does not store a unitary block of data bits alongside a unitary block of check bits. Additionally, memory unit 12 may interleave data bits and check bits based on their association with a particular (8,4) LBC. FIGS. 3A, 3B, 3C and 3D illustrate an example H-matrix 300 depicting the interleaved storage of data bits and check bits, the interleaved storage of multiple LBCs, and the relationship of syndrome bits to data bits and check bits in the (8,4) X 8 embodiment.

Figure 3B:
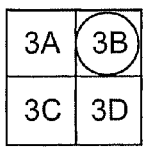

In FIG. 3B, a grouping 302 of bits may correspond to the bits stored in one memory device, a sub-unit of memory unit 12 that stores sixteen bits of the 64-bit code word 102. H-matrix 300 shows the distribution of code word 102 across four devices, including the memory device of grouping 302, when code word 102 is written to memory unit 12. Because code word 102 consists of eight (8,4) LBCs, it is possible to distribute two bits of each LBC, one data bit and one check bit, to each memory device, such that the bits of a single LBC are spread across four memory devices. For example, one LBC consists of the eight bits: D0 (reference numeral 304), D1 (reference numeral 306), D2 (reference numeral 308), D3 (reference numeral 310), C0 (reference numeral 312), C1 (reference numeral 314), C2 (reference numeral 316), and C3 (reference numeral 318). However, only two of those bits, D1 and C1, reside in the memory device of grouping 302. When multiple codes are interleaved to this degree, if an entire memory device fails, the resulting eight-bit corruption would still be detectable and correctable because the corruption would be distributed among multiple codes. The interleaving of codes could easily be scaled to larger code words; however, any degree of interleaving of LBCs across memory devices, even with a smaller code word, would decrease the likelihood that a single code would disproportionately bear the failure of a memory device. Such interleaving enhances the overall fault tolerance of the system.

When processor 10 sends memory read signal 104 to memory unit 12, memory unit 12 retrieves stored code word 106. Stored code word 106 may differ from code word 102 if a fault occurred in memory unit 12 in the time since code word 102 was written to memory unit 12. To determine if an error exists in stored code word 106, syndrome bit generator 16 may generate syndrome bits from stored code word 106. Table 2 shows the equations for generating syndrome bits in the (8,4) X 8 embodiment. To distinguish the stored data bits from the originally written

TABLE 2

Syndrome Bit Equations.

S0 = D1' XOR D2' XOR D3' XOR C0'
S1 = D0' XOR D2' XOR D3' XOR C1'
S2 = D0' XOR D1' XOR D3' XOR C2'
S3 = D0' XOR D1' XOR D2' XOR C3'
S4 = D5' XOR D6' XOR D7' XOR C4'
S5 = D4' XOR D6' XOR D7' XOR C5'
S6 = D4' XOR D5' XOR D7' XOR C6'
S7 = D4' XOR D5' XOR D6' XOR C7'
S8 = D9' XOR D10' XOR D11' XOR C8'
S9 = D8' XOR D10' XOR D11' XOR C9'
S10 = D8' XOR D9' XOR D11' XOR C10'
S11 = D8' XOR D9' XOR D10' XOR C11'
S12 = D13' XOR D14' XOR D15' XOR C12'
S13 = D12' XOR D14' XOR D15' XOR C13'
S14 = D12' XOR D13' XOR D15' XOR C14'
S15 = D12' XOR D13' XOR D14' XOR C15'
S16 = D17' XOR D18' XOR D19' XOR C16'
S17 = D16' XOR D18' XOR D19' XOR C17'
S18 = D16' XOR D17' XOR D19' XOR C18'
S19 = D16' XOR D17' XOR D18' XOR C19'
S20 = D21' XOR D22' XOR D23' XOR C20'
S21 = D20' XOR D22' XOR D23' XOR C21'
S22 = D20' XOR D21' XOR D23' XOR C22'
S23 = D20' XOR D21' XOR D22' XOR C23'
S24 = D25' XOR D26' XOR D27' XOR C24'
S25 = D24' XOR D26' XOR D27' XOR C25'
S26 = D24' XOR D25' XOR D27' XOR C26'
S27 = D24' XOR D25' XOR D26' XOR C27'
S28 = D29' XOR D30' XOR D31' XOR C28'

TABLE 2-continued

Syndrome Bit Equations.

S29 = D28' XOR D30' XOR D31' XOR C29'
S30 = D28' XOR D29' XOR D31' XOR C30'
S31 = D28' XOR D29' XOR D30' XOR C31' data bits, the stored bits are denoted with prime symbols. Therefore, D0 is the data bit as originally written to a location in memory unit 12, and D0' is the bit value stored in that same location in memory unit 12 at the time of a memory read.

The syndrome bit equations each act on three stored data bits and one stored check bit. In H-matrix 300, each row corresponds to a syndrome bit, and the intersection of a syndrome bit row with a column associated with a bit bears a 1 if the syndrome bit acts on the column bit. The intersection of that syndrome bit row with any other bit column bears a 0. Therefore, the row for syndrome bit S0 (reference numerals 320 and 322) bears a 1 only when intersecting with columns for bits C0, D1, D2, and D3 and bears a 0 at all other intersections.

Figure 4:
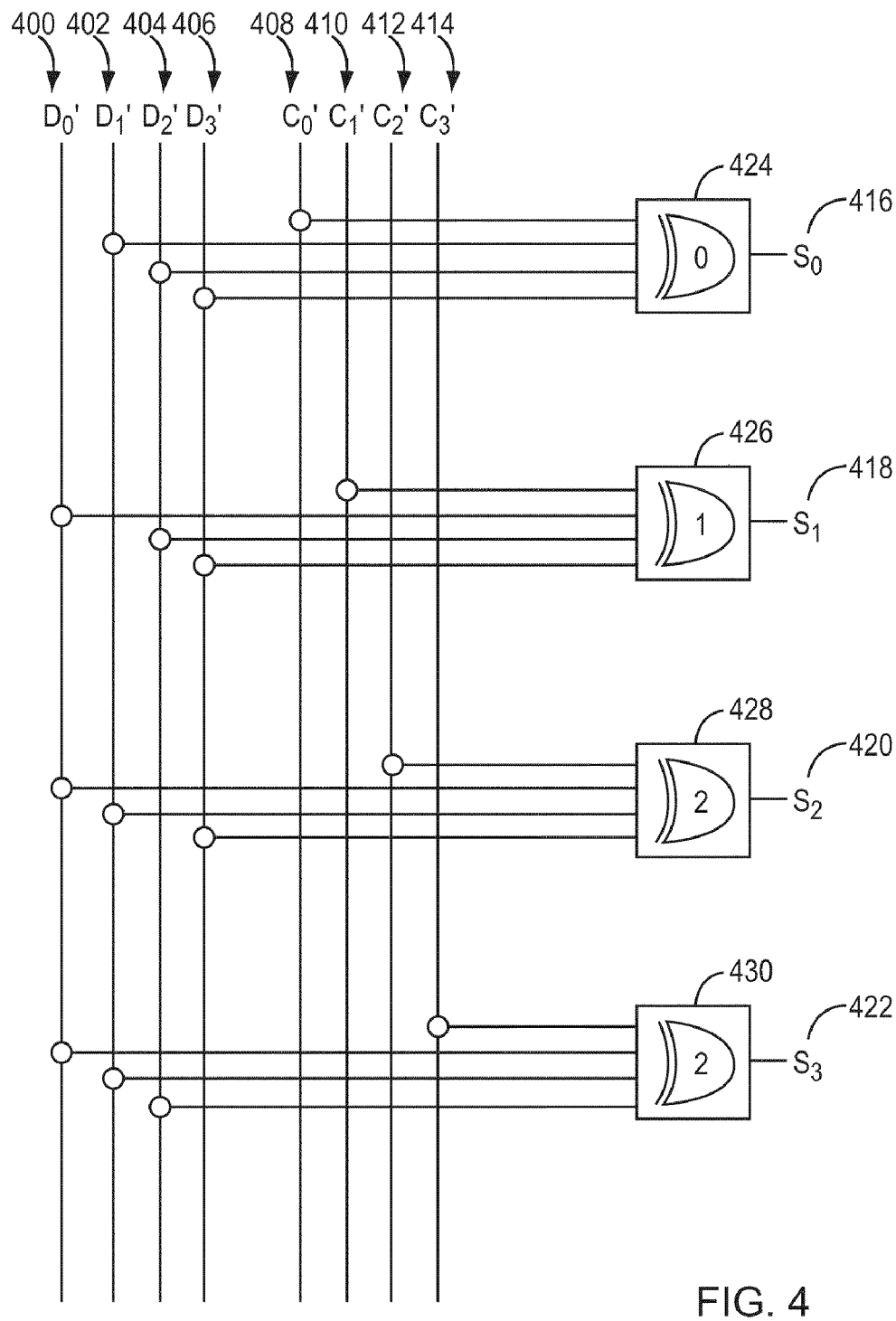
FIG. 4 is a schematic of portions of an example syndrome bit generator.

FIG. 4 schematically depicts the portion of example syndrome bit generator 16 that generates the syndrome bits in sets 324 and 326, marked on H-matrix 300 in FIGS. 3A, 3B, 3C and 3D. In FIG. 4, data lines 400, 402, 404, and 406 correspond to stored data bits D0', D1', D2', and D3', respectively, and data lines 408, 410, 412, and 414 correspond to stored check bits C0', C1', C2', and C3', respectively. Syndrome bits S0, S1, S2, and S3, which are generated using the stored data and check bits shown, are denoted by data lines 416, 418, 420, and 422. Each syndrome bit is generated using one stored check bit and the three stored data bits that correspond to the three to-be-stored data bits used to generate the check bit originally.

Blocks 424, 426, 428, and 430 indicate the logical operations that take place inside syndrome bit generator 16. As shown in Table 2, each syndrome bit is the output of an XOR operation on a check bit and the check bit's unique group of three data bits. For example, block 424 takes as its inputs D1' (from data line 402), D2' (from data line 404), D3' (from data line 406), and C0' (from data line 408) and generates S0 as an output. S0 is the result of the XOR of D1', D2', D3', and C0', and the symbol inside of block 424 is, again, the standard symbol representing the XOR function.

The use of a four-input XOR operation to generate a syndrome bit may be implemented in a single level of logic; for example, blocks 424, 426, 428, and 430 may be implemented as four respective LUTs in an FPGA. The particular implementation of blocks may vary, but any combination of logic gates and circuitry that is functionally equivalent to a four-input XOR operation may be used. Syndrome bit generator 16 may similarly generate the remaining 28 syndrome bits from appropriate groupings of stored data bits and stored check bits sent through a single level of digital logic as described by the equations in Table 2 and by H-matrix 300. Indeed, the same syndrome bit generation process may be used for any total number of data and check bits divisible by four.

Syndrome generator 16 may transmit the syndrome bits, also referred to collectively as the syndrome vector, to both correction bit generator 18 and uncorrectable error detector 20. Correction bit generator 18 may generate corrected bits from the syndrome vector; for example, Table 3 shows the equations for generating corrected bits in the (8,4) X 8 embodiment.

TABLE 3

Corrected Bit Equations.

D0" = S1 AND S2 AND S3 XOR D0'
D1" = S1 AND S2 AND S3 XOR D1'
D2" = S1 AND S2 AND S3 XOR D2'
D3" = S1 AND S2 AND S3 XOR D3'
D4" = S5 AND S6 AND S7 XOR D4'
D5" = S4 AND S6 AND S7 XOR D5'
D6" = S4 AND S5 AND S7 XOR D6'
D7" = S4 AND S5 AND S6 XOR D7'
D8" = S9 AND S10 AND S11 XOR D8'
D9" = S8 AND S9 AND S10 XOR D9'
D10" = S8 AND S9 AND S11 XOR D10'
D11" = S8 AND S9 AND S10 XOR D11'
D12" = S13 AND S14 AND S15 XOR D12'
D13" = S12 AND S14 AND S15 XOR D13'
D14" = S12 AND S13 AND S15 XOR D14'
D15" = S12 AND S13 AND S14 XOR D15'
D16" = S17 AND S18 AND S19 XOR D16'
D17" = S16 AND S18 AND S19 XOR D17'
D18" = S16 AND S17 AND S19 XOR D18'
D19" = S16 AND S17 AND S18 XOR D19'
D20" = S21 AND S22 AND S23 XOR D20'
D21" = S20 AND S22 AND S23 XOR D21'
D22" = S20 AND S21 AND S23 XOR D22'
D23" = S20 AND S21 AND S22 XOR D23'
D24" = S25 AND S26 AND S27 XOR D24'
D25" = S24 AND S26 AND S27 XOR D25'
D26" = S24 AND S25 AND S27 XOR D26'
D27" = S24 AND S25 AND S26 XOR D27'
D28" = S29 AND S30 AND S31 XOR D28'
D29" = S28 AND S30 AND S31 XOR D29'
D30" = S28 AND S29 AND S31 XOR D30'
D31" = S28 AND S29 AND S30 XOR D31'

Uncorrectable error detector 20 may use the syndrome vector to determine if the stored code word 106 contains any detectable yet uncorrectable errors. Correction bit generator 18 and uncorrectable error detector 20 may act on the syndrome bits in parallel and may each transmit information directly to processor 10.

Figure 5:
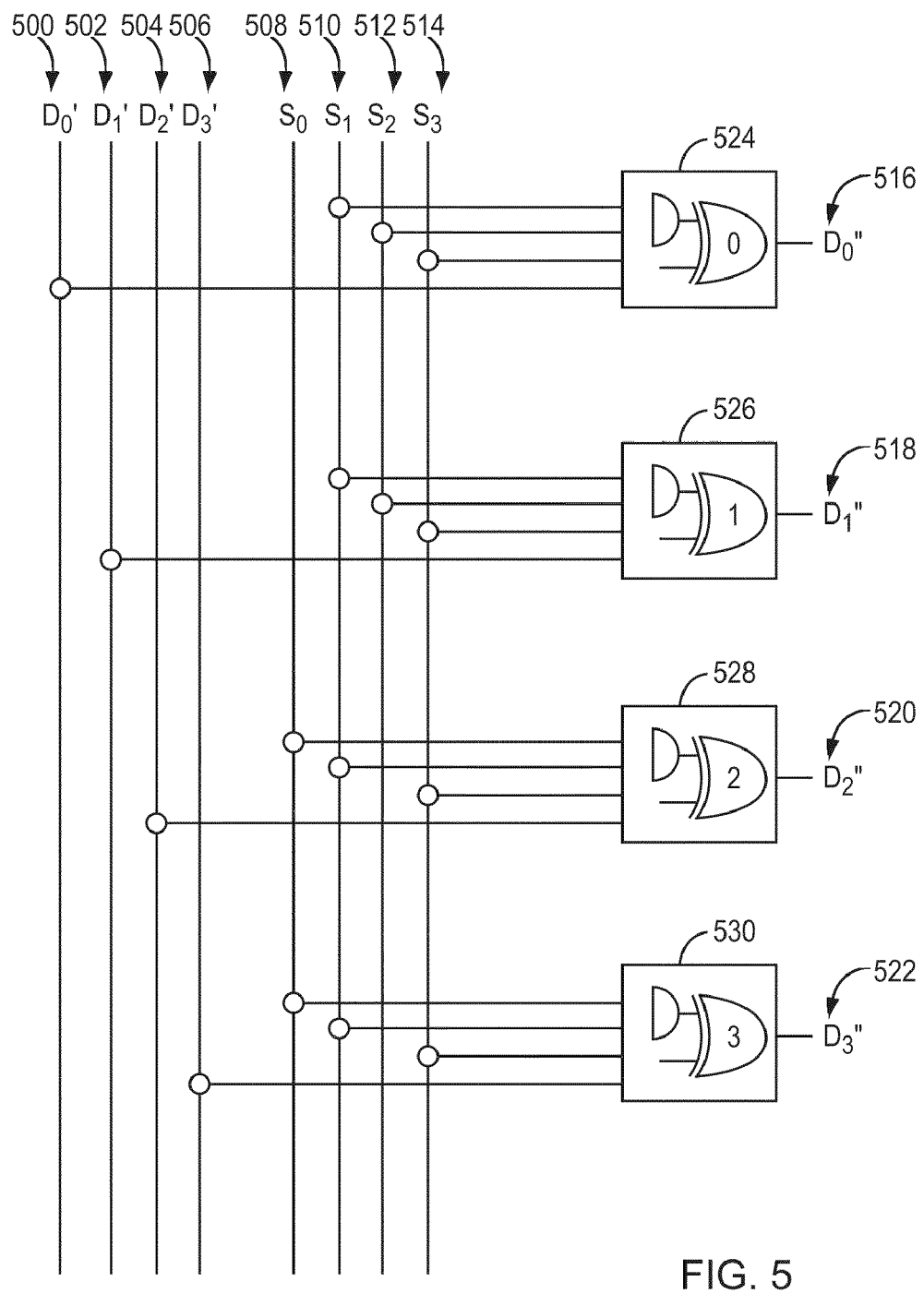
FIG. 5 is a schematic of portions of an example correction bit generator.

FIG. 5 schematically depicts the portion of example correction bit generator 18 that generates corrected bits based on the syndrome bits depicted in FIG. 4. In FIG. 5, data lines 500, 502, 504, and 506 correspond to stored data bits D0', D1', D2', and D3', respectively, and data lines 508, 510, 512, and 514 correspond to syndrome bits S0, S1, S2, and S3, respectively. Corrected data bits D0", D1", D2", and D3", all denoted as double prime to be distinguished from the to-be-stored data bits and the stored data bits, are generated using the stored data bits and syndrome bits shown. Corrected data bits D0", D1", D2", and D3" are denoted by data lines 516, 518, 520, and 522. Each corrected bit is generated using one stored data bit and the three syndrome bits that were generated using the stored data bit.

Blocks 524, 526, 528, and 530 indicate the logical operations that take place inside correction bit generator 18. As shown in Table 3, each corrected data bit is the output of a two-input XOR operation. One input of the XOR operation is the stored data bit, and the other input of the XOR operation is the output of a three-input AND operation on the three syndrome bits. For example, block 524 takes as its inputs D0' (from data line 502), S1 (from data line 510), S2 (from data line 512), and S3 (from data line 514) and generates D0" as an output. D0" is the result of the XOR of D0' and the AND of S1, S2, and S3, and the symbols inside of block 524 are the standard symbols representing the XOR and AND functions.

The combination XOR-and-AND operation used to generate a corrected bit may be implemented in a single level of logic; for example, blocks 524, 526, 528, and 530 may be implemented as four respective LUTs in an FPGA. The particular implementation of blocks may vary, but any combination of logic gates and circuitry that is functionally equivalent to a three-input AND operation in series with a two-input XOR operation may be used. Correction bit generator 18 may similarly generate the remaining 28 corrected bits from appropriate groupings of stored data bits and syndrome bits sent through a single level of digital logic as described by the equations in Table 3. Indeed, the same correction bit generation process may be used for any total number of data and syndrome bits divisible by four.

Correction bit generator 18 may transmit corrected memory word 110, the collection of all the corrected data bits, to processor 10 in response to memory read signal 104. In the preferred embodiment, processor 10 only receives data bits from correction bit generator 18, rather than receiving data bits both directly from memory unit 12 and indirectly through correction bit generator 18. This single path between processor 10 and memory unit 12 allows the execution time of a memory read—the time that elapses between when the processor sends a memory read signal to memory and when the processor receives data in response to the read request—to be hard-deterministic, that is, subject to the same bounds regardless of whether an error is detected in a memory word upon retrieval. An alternate embodiment may take advantage of the shorter data path directly from memory unit 12 to the processor 10 for memory words that contain no errors: for example, processor 10 may execute instructions subsequent to the memory read assuming that the word read directly from memory was without error and may backtrack if the error correction and detection logic determines that the retrieved word was in fact corrupted.

Table 4 shows the equations for determining if the syndrome bits in the (8,4) X 8 embodiment indicate the existence an uncorrectable error in stored code word 106. In that

TABLE 4

Uncorrectable Error Detection Equations.

U0 = NOT THREE OF FOUR (S0 S1 S2 S3)
AND (S0 OR S1 OR S2 OR S3)
U1 = NOT THREE OF FOUR (S4 S5 S6 S7)
AND (S4 OR S5 OR S6 OR S7)
U2 = NOT THREE OF FOUR (S8 S9 S10 S11)
AND (S8 OR S9 OR S10 OR S11)
U3 = NOT THREE OF FOUR (S12 S13 S14 S15)
AND (S12 OR S13 OR S14 OR S15)
U4 = NOT THREE OF FOUR (S16 S17 S18 S19)
AND (S16 OR S17 OR S18 OR S19)
U5 = NOT THREE OF FOUR (S20 S21 S22 S23)
AND (S20 OR S21 OR S22 OR S23)
U6 = NOT THREE OF FOUR (S24 S25 S26 S27)
AND (S24 OR S25 OR S26 OR S27)
U7 = NOT THREE OF FOUR (S28 S29 S30 S31)
AND (S28 OR S29 OR S30 OR S31)
UC1 = U0 OR U1 OR U2 OR U3
UC2 = U4 OR U5 OR U6 OR U7
UCE = UC0 OR UC1 embodiment, different groups of syndrome bits may indicate the presence of different uncorrectable errors. Therefore, the multiple uncorrectable error signals (U0, U1, etc. in Table 4) must be combined (into signals UC0 and UC1, which combine to generate signal UCE) to provide the processor with a single signal that indicates the existence of an uncorrectable error.

Figure 6:
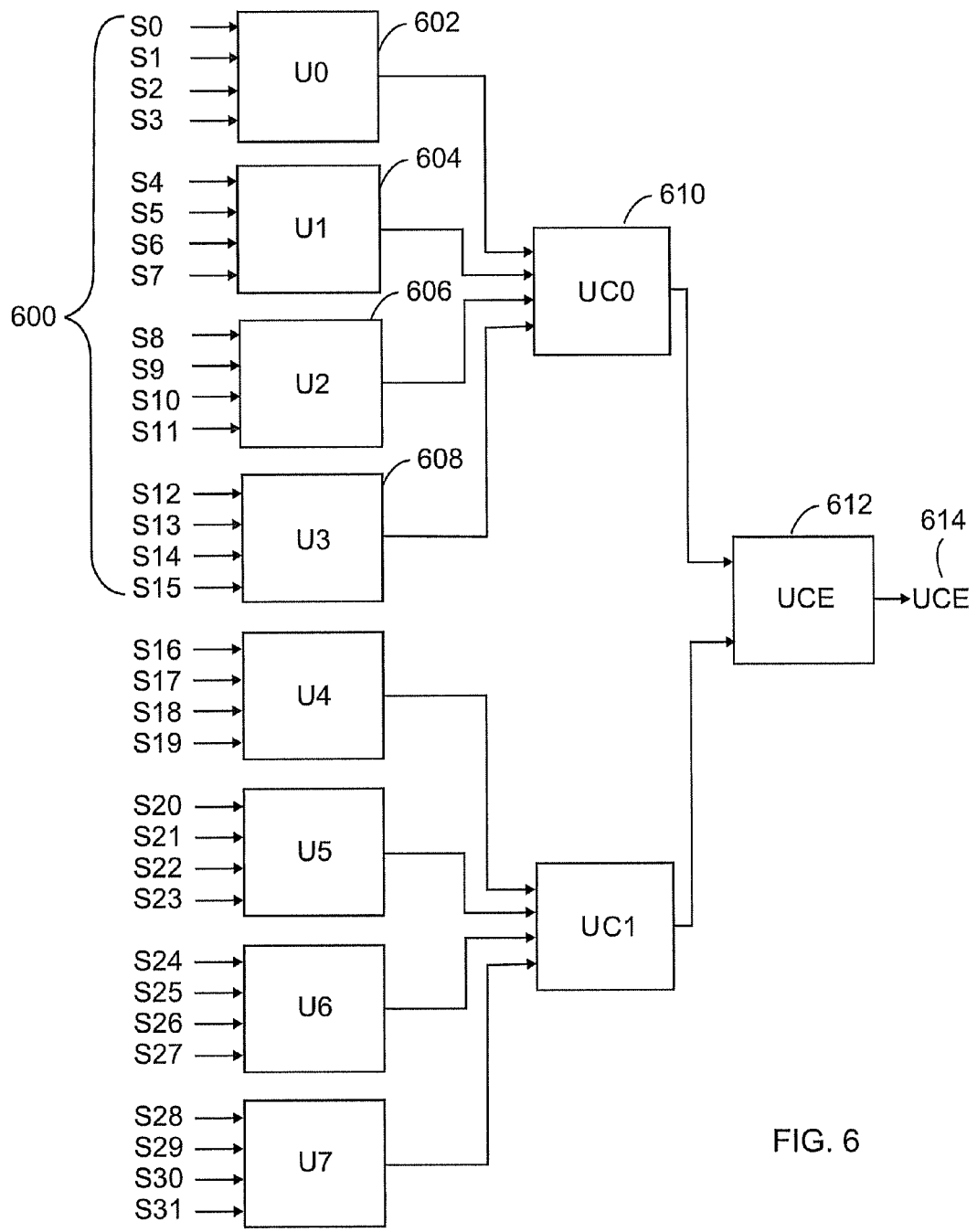
FIG. 6 is a schematic of an example uncorrectable error detector.

FIG. 6 schematically depicts example uncorrectable error detector 20 for the (8,4) X 8 embodiment. Uncorrectable error detector 20 has three levels of logic that together generate a consolidated uncorrectable error signal. The block labels in FIG. 6 correspond to the equation in Table 4 that each block implements. For example, block 602 takes in four of the inputs 600, specifically inputs S0, S1, S2, and S3, and performs an AND operation on two values, the OR of all four inputs and the NOT THREE OF FOUR of all four inputs. Table 5 defines the logical

TABLE 5

THREE OF FOUR Logical Operations.

| W | X | Y | Z | THREE OF FOUR (W X Y Z) | NOT THREE OF FOUR (W X Y Z) |
|---|---|---|---|---|---|
| 0 | 0 | 0 | 0 | 0 | 1 |
| 0 | 0 | 0 | 1 | 0 | 1 |
| 0 | 0 | 1 | 0 | 0 | 1 |
| 0 | 0 | 1 | 1 | 0 | 1 |
| 0 | 1 | 0 | 0 | 0 | 1 |
| 0 | 1 | 0 | 1 | 0 | 1 |
| 0 | 1 | 1 | 0 | 0 | 1 |
| 0 | 1 | 1 | 1 | 1 | 0 |
| 1 | 0 | 0 | 0 | 0 | 1 |
| 1 | 0 | 0 | 1 | 0 | 1 |
| 1 | 0 | 1 | 0 | 0 | 1 |
| 1 | 0 | 1 | 1 | 1 | 0 |
| 1 | 1 | 0 | 0 | 0 | 1 |
| 1 | 1 | 0 | 1 | 1 | 0 |
| 1 | 1 | 1 | 0 | 1 | 0 |
| 1 | 1 | 1 | 1 | 0 | 1 | operations THREE OF FOUR and NOT THREE OF FOUR in terms of four hypothetical inputs: W, X, Y, and Z. THREE OF FOUR is high or true when three of the four inputs, and only three inputs, are high or true. NOT THREE OF FOUR is the inverse of THREE OF FOUR.

In uncorrectable error detector 20, first level blocks feed into second level blocks that in turn feed into a third level block that generates the consolidated uncorrectable error signal. In FIG. 6, the outputs of first level blocks 602, 604, 606, and 608 serve as inputs to second level block 610. Block 610 acts on these inputs, in accordance with the equations of Table 4, by performing an OR operation on all four inputs and outputs the result as an input to third level block 612. Block 612, in turn, performs an OR operation on its inputs, and the output of block 612 is the consolidated uncorrectable error signal 614.

The logical operations used to generate the uncorrectable error signals may be implemented in a hierarchical levels of logic. Blocks 602, 604, 606, and 608, for instance, may be implemented as four respective LUTs in an FPGA and may constitute one level of logic. Blocks 610 and 612 may also be implemented using LUTs and may each constitute another level of logic. The particular implementation of blocks may vary, but any combination of logic gates and circuitry that is functionally equivalent to the equations in Table 4 may be used. Uncorrectable error detector 20 may use as many levels of logic as needed for the number of data bits, and thus syndrome bits, present. However, the first level of uncorrectable error logic may be as described in the U1 through U7 equations in Table 4, regardless of the number of syndrome bits, and all subsequent levels of logic may be combining the first level outputs through a series of OR operations.

Processor 10 may react several different ways to receiving a consolidated uncorrectable error signal that indicates that an uncorrectable error exists in stored code word 106. In one embodiment, processor 10 may restart execution of the program if an uncorrectable error exists. In another embodiment, processor 10 may cause stored code word 106, or memory unit 12, to be refreshed from another storage device; for example, if memory unit 12 is RAM, it may be refreshed from a permanent hard disk. In yet another embodiment, processor 10 may record the uncorrectable error and proceed with execution of the program.

A variety of examples have been described above, all dealing with the detection and correction of errors using an equal number of data bits and check bits and interleaving data and check bits in memory. However, those skilled in the art will understand that changes and modifications may be made to these examples without departing from the true scope and spirit of the present invention, which is defined by the claims. For example, the various units of error detection and correction may be consolidated into fewer units or divided into more units as necessary for a particular embodiment. Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. A system for detecting and correcting memory errors in a memory word containing N data bits, wherein N is a numerical multiple of 4, using an interleaved code word containing 2N bits, wherein N bits are check bits and the remaining N bits are the data bits from the memory word, and wherein the check bits and the data bits are interleaved, the system comprising:

a check bit generator coupled to a processor and a memory, comprising N check bit generator blocks divided into groups, wherein a check bit generator block performs logical operations on inputs to generate an output, wherein each check bit generator block applies a logical operation of XOR on three data bits, wherein a group of 4 check bit generator blocks takes four data bits as inputs and generates four check bits as outputs, and wherein each check bit is determined from a unique group of three data bits;

a syndrome bit generator coupled to the memory, comprising N syndrome bit generator blocks to generate N syndrome bits, wherein each syndrome bit is the output of a syndrome bit generator block, wherein each syndrome bit generator block applies a logical operation of XOR on four bits comprising three date bits and one check bit in total, and wherein the three data bits are the unique group; and a correction bit generator coupled to the syndrome bit generator and the processor, comprising N correction bit generator blocks, wherein each correction bit generator block has four inputs, one data bit and three syndrome bits, and one output, wherein the data bit input to a correction bit generator block is a data bit to be corrected, wherein the three syndrome bits input to the correction bit generator block are the three syndrome bits that were determined using the data bit to be corrected, wherein each correction bit generator block applies a logical operation of XOR on a result and the data bit, wherein the result outputs from a logical operation of AND on the three syndrome bits, and wherein a corrected data bit is the output of the correction bit generator block.

2. The system of claim 1, further comprising an uncorrectable error detector coupled to the correction bit generator and the processor, comprising:

a first level of N divided by 4 blocks, wherein each N divided by 4 block takes four sequential syndrome bits as inputs, wherein each syndrome bit is only input to one block, wherein each N divided by 4 block applies a logical operation of AND on a first result and a second result, wherein the first result outputs from a logical operation of NOT THREE OF FOUR on all four syndrome bits, wherein the second result outputs from a logical operation of OR on all four syndrome bits, and wherein each N divided by 4 block outputs a signal that indicates the presence or absence of an uncorrectable error.

3. The system of claim 2, wherein the uncorrectable error detector generates a consolidated uncorrectable error signal, wherein the consolidated uncorrectable error signal results from a logical operation of OR on all first level block outputs, and wherein the consolidated uncorrectable error signal is true when an uncorrectable error exists in the memory word.

4. The system of claim 3, wherein the consolidated uncorrectable error signal causes a memory unit storing the memory word to be refreshed from a storage device when an uncorrectable error exists.

5. The system of claim 3, wherein the consolidated uncorrectable error signal causes a program to restart when an uncorrectable error exists.

6. The system of claim 3, wherein an uncorrectable error is recorded when the consolidated uncorrectable error signal indicates that an uncorrectable error exists.

7. The system of claim 3, wherein N equals 32, wherein the uncorrectable error detector further comprises a second level of 2 blocks and a third level block, wherein each second level block takes as inputs four outputs from the first level of N divided by 4 blocks, wherein each output from the first level of N divided by 4 blocks is only input to one second level block, wherein each second level block applies a logical operation of OR on all four inputs, wherein the third level block takes as input the outputs of the second level blocks, wherein the third level block applies a logical operation of OR on the outputs of the second level blocks, and wherein the output of the third level block is consolidated uncorrectable error signal.

8. The system of claim 1, wherein the check bit generator blocks, syndrome bit generator blocks and correction bit generator blocks each comprise look-up tables (LUTs), and wherein the system is configured for implementation using a field-programmable gate array (FPGA).

9. The system of claim 1, further comprising a processing unit that writes to a memory unit, wherein the processing unit generates the N data bits of the memory word upon executing a memory write instruction, wherein the check bit generator is disposed between the processing unit and the memory unit, and wherein the interleaved code word is written to the memory unit.

10. The system of claim 1, further comprising a processing unit that reads from a memory unit, wherein the processing unit accesses the memory word in the memory unit upon executing a memory read instruction, wherein the syndrome bit generator and the correction bit generator are disposed between the memory unit and the processing unit, and wherein the processing unit receives the N corrected data bits.

11. The system of claim 1, wherein the interleaved code word constitutes at least two (8,4) Linear Block Codes, wherein N is at least 8, and wherein the multiple (8,4) Linear Block Codes are interleaved across multiple devices within a memory unit.

12. A system for detecting and correcting memory errors, wherein a processing unit, operable to write to and read from a memory unit, generates a memory word containing N data bits, wherein N is a numerical multiple of 4, the system comprising:

an interleaved code word containing 2 N bits, wherein N bits are check bits and the remaining N bits are the data bits from the memory word, and wherein the interleaved code word is written to the memory unit;

a check bit generator coupled to a processor and a memory, comprising N check bit generator blocks divided into groups, wherein a check bit generator block performs logical operations on inputs to generate an output, wherein each group contains 4 check bit generator blocks and each check bit generator block is in only one group, wherein each check bit is the output of a check bit generator block, wherein each check bit generator block applies a logical operation of XOR on three data bits, wherein a group of 4 blocks takes four data bits as inputs and generates four check bits as outputs, and wherein each check bit is determined from a unique group of three data bits;

a syndrome bit generator coupled to the memory, comprising N syndrome bit generator blocks to generate N syndrome bits, wherein each syndrome bit is the output of a syndrome bit generator block, wherein each syndrome bit generator block applies a logical operation of XOR on four bits comprising three data bits and one check bit in total, and wherein the three data bits are the unique group of data bits from which the check bit was determined; and a correction bit generator coupled to the syndrome bit generator and the processor, comprising N correction bit generator blocks, wherein each correction bit generator block has four inputs, one data bit and three syndrome bits, and one output, wherein the data bit input to a correction bit generator block is a data bit to be corrected, wherein the three syndrome bits input to the correction bit generator block are the three syndrome bits that were determined using the data bit to be corrected, wherein each correction bit generator block applies a logical operation of XOR on a result and the data bit, wherein the result outputs from a logical operation of AND on the three syndrome bits, wherein a corrected data bit is the output of the correction bit generator block, and wherein the processing unit reads corrected data bits when the processing unit accesses the memory word in the memory unit.

13. A method for detecting and correcting memory errors in an interleaved code word containing 2N bits, wherein the N bits are check bits and the remaining N bits are data bits from a memory word, wherein the memory word contains N data bits, wherein N is a numerical multiple of 4, and wherein the check bits of the code word and the data bits of the code word are interleaved, comprising:

generating the check bits of the code word using N check bit generator blocks divided into groups, wherein a check bit generator block performs logical operations on inputs to generate an output, wherein each group contains 4 check bit generator blocks and each block is in only one group, wherein each check bit is the output of a check bit generator block, wherein each check bit generator block applies a logical operation of XOR on three data bits, wherein a group of 4 blocks takes four data bits as inputs and generates four check bits as outputs, and wherein each check bit is determined from a unique group of three data bits;

generating N syndrome bits using N syndrome bit generator blocks, wherein each syndrome bit is the output of a syndrome bit generator block, wherein each syndrome bit generator block applies a logical operation of XOR on four bits comprising three data bits and one check bit in total, and wherein the three data bits are the unique group of three data bits from which the check bit was determined; and correcting data bits using a correction bit generation, comprising N correction bit generator blocks, wherein each correction bit generator block has four inputs, one data bit and three syndrome bits, and one output, wherein the data bit input to a correction bit generator block is a data bit to be corrected, wherein the three syndrome bits input to the correction bit generator block are the three syndrome bits that were determined using the data bit to be corrected, wherein each correction bit generator block applies a logical operation of XOR on a result and the data bit, wherein the result outputs from a logical operation of AND on the three syndrome bits, and wherein a corrected data bit is the output of the correction bit generator block.

14. The method of claim 13, further comprising detecting uncorrectable errors using an uncorrectable error detector, comprising a first level of N divided by 4 blocks, wherein each N divided by 4 block takes four sequential syndrome bits as inputs, wherein each syndrome bit is only input to one block, wherein each N divided by 4 block applies a logical operation of AND on a first result and a second result, wherein the first result outputs from a logical operation of NOT THREE OF FOUR on all four syndrome bits, wherein the second result outputs from a logical operation of OR on all four syndrome bits, and wherein each N divided by 4 block outputs a signal that indicates the presence or absence of an uncorrectable error.

15. The method of claim 14, further comprising generating a consolidated uncorrectable error signal, wherein the consolidated uncorrectable error signal results from a logical operation of OR on all first level N divided by 4 block outputs from the uncorrectable error detector, and wherein the consolidated uncorrectable error signal is true when an uncorrectable error exists in the memory word.

16. The method of claim 14, further comprising refreshing a memory unit where the memory word is stored when an uncorrectable error exists.

17. The method of claim 14, further comprising restarting a program when an uncorrectable error exists.

18. The method of claim 13, further comprising writing the interleaved code word to a memory unit.

19. The method of claim 18, wherein the interleaved code word constitutes at least two (8,4) Linear Block Codes, wherein N is at least 8, wherein writing the interleaved code word to a memory unit comprises interleaving the multiple (8,4) Linear Block Codes across multiple memory devices within the memory unit.

20. The method of claim 13, further comprising:
accessing the memory unit to read the memory word; and
reading the corrected data bits.

* * * * *